United States Patent [19]
Ito et al.

[11] Patent Number: 6,162,710
[45] Date of Patent: Dec. 19, 2000

[54] METHOD FOR MAKING MIS TRANSISTOR

[75] Inventors: Hiroshi Ito; Tadahiko Horiuchi, both of Tokyo, Japan

[73] Assignee: NEC Corporation, Tokyo, Japan

[21] Appl. No.: 09/092,649

[22] Filed: Jun. 9, 1998

[30] Foreign Application Priority Data

Jun. 9, 1997 [JP] Japan ..................... 9-150881

[51] Int. Cl.[7] .............................. H01L 21/336
[52] U.S. Cl. .................. 438/528; 438/291; 438/305; 438/528
[58] Field of Search ..................... 438/289, 528, 438/291, 305, 529, FOR 158

[56] References Cited

U.S. PATENT DOCUMENTS

| 4,522,657 | 6/1985 | Rohatgi et al. | 148/1.5 |
| 4,584,026 | 4/1986 | Wu et al. | 148/1.5 |

FOREIGN PATENT DOCUMENTS

| 5-102471 | 4/1993 | Japan . |
| 6-260645 | 9/1994 | Japan . |
| 6-260645 A1 | 9/1994 | Japan . |
| 06144278 | 1/1996 | Japan . |
| 8-18047 | 1/1996 | Japan . |

OTHER PUBLICATIONS

Wolf, "Silicon Processing for the VLSI, vol. 2: Process Integration", Lattice Press, Sunset Beach, CA 1990, pp. 333–334 and 354–359.

*Primary Examiner*—George Fourson
*Assistant Examiner*—Barbara Abbott
*Attorney, Agent, or Firm*—Foley & Lardner

[57] ABSTRACT

Disclosed is a method for making a MIS transistor that a gate electrode and gate insulating film are formed on a semiconductor substrate with a channel region formed implanting an impurity of one conductivity type thereinto, which has the steps of: implanting hydrogen ions through said gate electrode and gate insulating film into said channel region under said gate electrode; ion-implanting an impurity of a conductivity type reverse to said one conductivity type self-aligned to said gate electrode to form a source/drain region; and conducting thermal treatment in an inert atmosphere or nitrogen atmosphere.

36 Claims, 16 Drawing Sheets

8A SOURCE/DRAIN n+REGION

8B ACTIVATED SOURCE/DRAIN N+ REGION

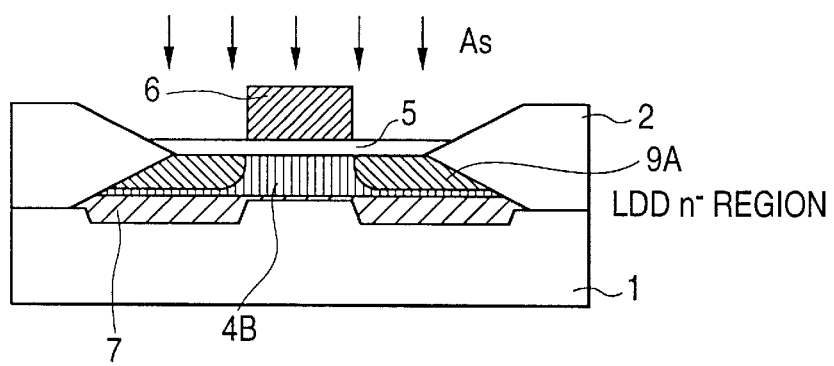
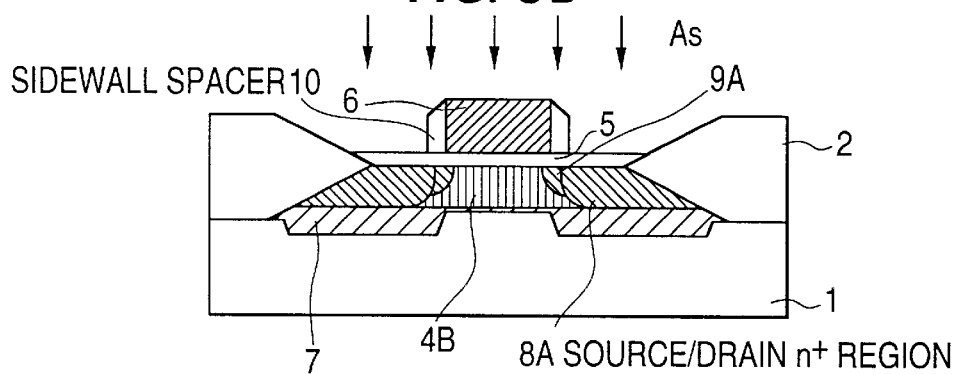
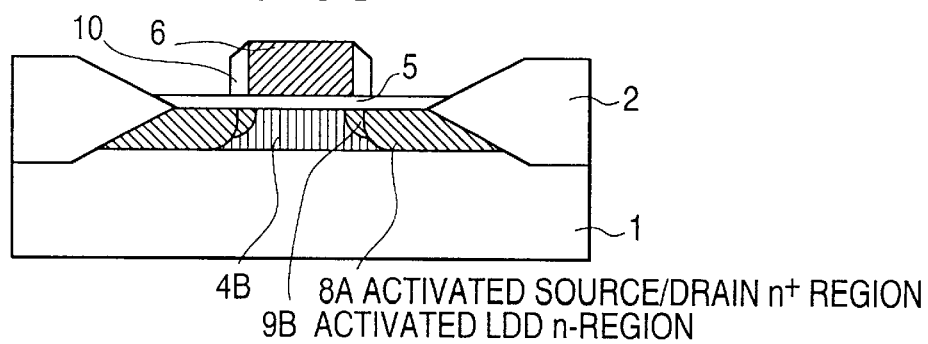

METHOD FOR MAKING MIS TRANSISTOR

FIELD OF THE INVENTION

This invention relates to a method for making a MIS transistor, and more particularly to, a method for making the channel region and source/drain regions of a MIS transistor.

BACKGROUND OF THE INVENTION

A MIS transistor is a transistor that has a three-layer structure of metal-insulating film-semiconductor and the surface conductivity of the semiconductor is controlled through the insulator by applying a voltage to the metal electrode. For example, a MOS transistor with silicon dioxide as the insulating film is included therein. In particular, a MOS field-effect transistor (MOSFET) is generally used for a semiconductor integrated circuit.

As a method of introducing an impurity into a semiconductor substrate, solid phase diffusion and plasma doping etc. are included. However, used most typically is the ion implantation described above. The merit of the ion implantation is that the impurity profile (concentration distribution) and impurity concentration can be formed with a good reproducibility. Therefore, the ion implantation is typically used in a process of introducing an impurity into a semiconductor substrate to form a well, a source/drain etc.

However, the ion implantation has a demerit that a damage region is generated due to the ion-implanting. A 'damage region' means a region that includes interstitial silicon atoms caused by a silicon atom in the semiconductor substrate being dispersed from a crystal lattice position due to the ion-implanting and a vacancy generated at the crystal lattice. In most cases, such a damage region can be recovered by thermal treatment to be conducted thereafter in a semiconductor fabrication process. Namely, the reduction of yield caused by the damage region is not so big, and no electrical abnormal leakage caused by the damage region occurs.

Also, the ion implantation has another demerit in that interstitial silicon atoms dispersed from a crystal lattice position due to the ion-implanting promotes the abnormal diffusion of impurities, i.e., enhanced diffusion. 'Enhanced diffusion' means a phenomenon that an impurity, such as boron, and a silicon atom dispersed are formed into a pair and the pair including the impurity diffuses faster than an ordinary diffusion in bulk. The enhanced diffusion is difficult to control and adversely affects the electrical characteristics of the MOSFET.

In a MOSFET used for a semiconductor integrated circuit, lowering the threshold voltage as well as suppressing the short-channel effect is needed to meet the requirements of high integration, fine structure, high speed and low voltage (low consumed power). However, the enhanced diffusion causes an inverse short-channel effect in that the threshold voltage becomes higher at the short channel region rather than the long channel region. Furthermore, it may cause a punch-through at the short channel region.

As described above, in conventional methods for fabricating a MOSFET, the enhanced diffusion of impurities at the channel region is a reason preventing enhanced performance of the MOSFET.

On the other hand, the present inventors have proposed a MIS transistor and a method for making the same wherein enhanced diffusion can be suppressed in conducting ion implantation as described in Japanese patent application laid-open No. 8-18047(1996).

In the method of Japanese patent application laid-open No. 8-18047(1996), boron is implanted through the gate electrode and gate oxide film into the channel region of the MOSFET. Therefore, boron is introduced into the gate oxide film. However, due to boron existing in the gate oxide film, the long-term reliability of the gate oxide film may be deteriorated.

Before explaining a method for making a MIS transistor in the preferred embodiments, the aforementioned conventional method for making MOSFET will be explained below.

FIGS. 1A to 2B are cross sectional views showing a method for making n-MOSFET. At first, as shown in FIG. 1A, a field oxide film 102 in the device separating region and a sacrifice oxide film 103 in the device region are formed by using LOCOS (local oxidation of silicon) etc. on a p-type semiconductor substrate 101. Then, as shown in FIG. 1B, by ion-implanting boron (B) to control a threshold voltage of n-MOSFET through the sacrifice oxide film 103 into the device region, a $p^-$ channel region 104A is formed. In a typical process of fabricating the MOSFET, an impurity is implanted at several separated steps on several kind of conditions to optimize the impurity profile of channel region to suppress the short-channel effect and punch-through effect other than the control of threshold voltage. The thermal treatment is then conducted to recover the damage of the boron implantation and to activate boron in a nitrogen atmosphere. Thus, the $p^-$ channel region 104A is changed into an activated $p^-$ channel region 104B. Further, the sacrifice oxide film 103 is removed by etching. Then, as shown in FIG. 1C, gate oxide film 105 and a gate electrode 106 are sequentially formed.

Then, as shown in FIG. 2A, by ion-implanting arsenic (As) self-aligned to the gate electrode 106, a source/drain $n^+$ region 107A is formed. Finally, as shown in FIG. 2B, the thermal treatment is conducted to sufficiently electrically activate the source/drain $n^+$ region 107A formed by the arsenic implantation. Thereby, an activated source/drain $n^+$ region 107B is formed, thereby obtaining n-MOSFET.

The mechanism of reverse short-channel effect will be explained below. FIGS. 4A and 4B are cross sectional views showing two n-MOSFETs with different channel lengths. FIG. 4A shows a long-channel n-MOSFET. For example, in forming $n^+$ diffusion region 111 by ion-implanting arsenic, interstitial silicon atoms generates, and thereby the enhanced diffusion of boron happens. In this case, the boron concentration around the $n^+$ diffusion region 111 is reduced as shown in FIG. 4A (a region 112 in FIG. 4A). Boron moved by the enhanced diffusion is captured by a defect region in the $n^+$ diffusion region 111 or accumulated at a source/drain end (a region 114 in FIG. 4A) on the surface of substrate and just under a gate electrode 113A.

On the other hand, FIG. 4B shows a short-channel n-MOSFET. Due to this short channel, the boron concentration at the channel region becomes relatively higher (a region 114 in FIG. 4B), therefore the reverse short-channel effect generates. Further, in such an n-MOSFET with short channel, the punch-through may occur since a region 112 of a very low boron concentration is formed just under the region 114 of a high boron concentration. Namely, due to the enhanced diffusion, suppressing the short-channel effect and lowering the threshold voltage becomes difficult to realize. Accordingly, how to suppress the enhanced diffusion is a key concern.

Next, the method for fabricating n-MOSFET disclosed in Japanese patent application laid-open No. 8-18047(1996) will be explained in FIGS. 5A to 6B. At first, field oxide film 102, gate oxide film 105 and a gate electrode 106 are formed on a p-type semiconductor substrate 101 as shown in FIG.

5A. Then, as shown in FIG. 5B, a source/drain n⁺ region 107A is formed by ion-implanting arsenic self-aligned to the gate electrode 106. At this time, the source/drain n⁺ region 107A is not activated. Then, as shown in FIG. 5C, thermal treatment is conducted at a high temperature, e.g., 900° C. for 10 min. or 1000° C. for 30 sec. in a nitrogen atmosphere. Interstitial silicon atoms that generate in implanting arsenic and cause the boron enhanced diffusion can be re-connected with a vacancy by this thermal treatment, thereby almost disappearing.

Then, as shown in FIG. 6A, boron atoms of $10^{12}$ to $10^{13}/cm^2$ are implanted through the gate electrode 106 into the semiconductor substrate 101 to form a p⁻ channel region 104A. Finally, as shown in FIG. 6B, thermal treatment is conducted at a temperature of 800 to 900° C. in a nitrogen atmosphere to form an activated p⁻ channel region 104B.

Thus, interstitial silicon atoms generated by the arsenic implantation almost disappear by the step in FIG. 5C and interstitial silicon atoms generated by the boron implantation of $10^{12}$ to $10^{13}/cm^2$ are not so many. Therefore, a significant enhanced diffusion does not occur in the thermal treatment of 800 to 900°.

SUMMARY OF THE INVENTION

Accordingly, it is an object of the invention to provide a method for making a MIS transistor that the enhanced diffusion of impurity can be better controlled to obtain a low threshold voltage and the short-channel effect can be suppressed.

According to the invention, a method for making a MIS transistor that a gate electrode and gate insulating film are formed on a semiconductor substrate with a channel region formed implanting an impurity of one conductivity type thereinto, comprises the steps of:

implanting hydrogen ions through the gate electrode and gate insulating film into the channel region under the gate electrode;

ion-implanting an impurity of a conductivity type reverse to the one conductivity type self-matchingly to the gate electrode to form a source/drain region; and conducting thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

ion-implanting an impurity of a conductivity type reverse to the one conductivity type self-matchingly to the gate electrode to form a source/drain region;

implanting hydrogen ions through the gate electrode and gate insulating film into the channel region under the gate electrode; and conducting thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

implanting hydrogen ions through the gate electrode and gate insulating film into the channel region under the gate electrode;

ion-implanting a first impurity of a conductivity type reverse to the one conductivity type self-matchingly to the gate electrode to form a LDD region;

ion-implanting a second impurity of the same conductivity type as the first impurity self-matchingly to the gate electrode to form a source/drain region; and conducting thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

ion-implanting a first impurity of a conductivity type reverse to the one conductivity type self-matchingly to the gate electrode to form a LDD region;

ion-implanting a second impurity of the same conductivity type as the first impurity self-matchingly to the gate electrode to form a source/drain region;

implanting hydrogen ions through the gate electrode and gate insulating film into the channel region under the gate electrode; and conducting thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

implanting hydrogen ions through the gate electrode and gate insulating film into the channel region under the gate electrode;

ion-implanting a first impurity of a conductivity type reverse to the one conductivity type self-matchingly to the gate electrode to form a LDD region;

conducting first thermal treatment in an inert atmosphere or nitrogen atmosphere;

ion-implanting a second impurity of the same conductivity type as the first impurity self-matchingly to the gate electrode to form a source/drain region; and conducting second thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

implanting hydrogen ions through the gate electrode and gate insulating film into the channel region under the gate electrode;

ion-implanting a first impurity of a conductivity type reverse to the one conductivity type self-matchingly to the gate electrode to form a LDD region;

conducting first thermal treatment in an inert atmosphere or nitrogen atmosphere;

ion-implanting a second impurity of the same conductivity type as the first impurity self-matchingly to the gate electrode to form a source/drain region; and conducting second thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

implanting hydrogen ions through the gate electrode and gate insulating film into the channel region under the gate electrode;

ion-implanting a first impurity of a conductivity type reverse to the one conductivity type self-matchingly to the gate electrode to form a LDD region;

conducting first thermal treatment in an inert atmosphere or nitrogen atmosphere;

implanting hydrogen ions through the gate electrode and gate insulating film into the channel region under the gate electrode;

ion-implanting a second impurity of the same conductivity type as the first impurity self-matchingly to the gate electrode to form a source/drain region; and conducting second thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

ion-implanting a first impurity of a conductivity type reverse to the one conductivity type self-matchingly to the gate electrode to form a LDD region;

implanting hydrogen ions through the gate electrode and gate insulating film into the channel region under the gate electrode;

conducting first thermal treatment in an inert atmosphere or nitrogen atmosphere;

implanting hydrogen ions through the gate electrode and gate insulating film into the channel region under the gate electrode;

ion-implanting a second impurity of the same conductivity type as the first impurity self-matchingly to the gate electrode to form a source/drain region; and conducting second thermal treatment in an inert atmosphere or nitrogen atmosphere.

According to another aspect of the invention, a method for making a MIS transistor that a gate electrode and gate insulating film are formed on a semiconductor substrate with a channel region formed implanting an impurity of one conductivity type thereinto, comprises the steps of:

implanting hydrogen ions through the gate electrode and gate insulating film into the channel region under the gate electrode;

ion-implanting a first impurity of a conductivity type reverse to the one conductivity type self-matchingly to the gate electrode to form a LDD region;

conducting first thermal treatment in an inert atmosphere or nitrogen atmosphere;

ion-implanting a second impurity of the same conductivity type as the first impurity self-matchingly to the gate electrode to form a source/drain region;

implanting hydrogen ions through the gate electrode and gate insulating film into the channel region under the gate electrode; and conducting second thermal treatment in an inert atmosphere or nitrogen atmosphere.

According to another aspect of the invention, a method for making a MIS transistor gate electrode and gate insulating film are formed on a semiconductor substrate with a channel region formed implanting an impurity of one conductivity type thereinto, comprises the steps of:

ion-implanting a first impurity of a conductivity type reverse to the one conductivity type self-matchingly to the gate electrode to form a LDD region;

implanting hydrogen ions through the gate electrode and gate insulating film into the channel region under the gate electrode;

conducting first thermal treatment in an inert atmosphere or nitrogen atmosphere;

ion-implanting a second impurity of the same conductivity type as the first impurity self-matchingly to the gate electrode to form a source/drain region;

implanting hydrogen ions through the gate electrode and gate insulating film into the channel region under the gate electrode; and conducting second thermal treatment in an inert atmosphere or nitrogen atmosphere.

In accordance with an embodiment of the present invention, hydrogen ion implantation is conducted before conducting the thermal treatment for activating an arsenic implantation region in forming source/drain region in an MIS transistor fabrication. Due to this, the enhanced diffusion of impurities in the channel region caused by interstitial atoms generated by the arsenic implantation for forming the source/drain region in the conventional methods can be controlled. Also, this technique can be applied to the fabrication of an LDD (lightly doped drain) transistor with an LDD structure that the short-channel effect can be reduced. After implanting hydrogen ion, the heat treatment of a semiconductor substrate for MIS transistor is conducted at a predetermined temperature to activate the source/drain region or LDD region. The hydrogen ion implantation and the thermal treatment thereafter can be conducted one or more times in the fabrication process. Also, between the hydrogen ion implantation and the thermal treatment, another process can be inserted.

FIG. 14 is a cross sectional view showing a semiconductor device that a n$^+$ diffusion region 11 and a p-well 12 are formed. The impurity concentration profile of the p-n junction between the n$^+$ diffusion region 11 and the p-well 12 is measured at the cross section i–i' by SIMS (secondary ion mass spectroscopy). The measurement results will be shown below as well as the proper conditions of hydrogen ion implantation to be considered therefrom.

FIG. 15 shows the boron profiles in the depth direction before and after activating arsenic in the source/drain region. Boron is ion-implanted $2\times10^{13}$ atoms/cm$^2$ at 300 keV (first implantation), $4\times10^{13}$ atoms/cm$^2$ at 100 keV (second implantation) and then $6\times10^{12}$ atoms/cm$^2$ at 30 keV (third implantation). After implanting, thermal treatment is conducted at 850° C. for 30 min in a nitrogen atmosphere. Arsenic for the source/drain region is ion-implanted $1.5\times 10^{15}$ atoms/cm$^2$ at 100 keV. The activation of arsenic is conducted at 1020° C. for 10 sec. by ultraviolet lamp annealing. A dotted line in FIG. 15 is a boron concentration profile before activating the source/drain region and a full line in FIG. 15 is a boron concentration profile after activating the source/drain region. The p-n junction is located 100 nm deep.

As shown in FIG. 15, the re-distribution of boron occurs due to the enhanced diffusion in the activating and the boron concentration falls down at the p-n junction. This phenomenon corresponds to that in FIG. 4A. Also, the boron concentration is rising up from 50 nm depth. This shows that boron at the p-n junction is captured by a defect region generated in arsenic implantation due to the enhanced diffusion.

FIG. 16 shows the concentration profiles in the depth direction of hydrogen to be ion-implanted $2\times10^{15}$ atoms/cm$^2$ at 11 keV and of boron to be ion-implanted under the conditions in FIG. 15. A projective range $R_p$ of hydrogen at 11 keV is about 150 nm.

Also, FIG. 17 shows the hydrogen-ion-implantation dose dependency of boron concentration profile after the activation by thermal treatment of 1020°0 C. for 10 sec. A dotted line in FIG. 17 is a boron concentration profile before activating the source/drain region by thermal treatment and full lines in FIG. 17 are boron concentration profiles after activating the source/drain region by thermal treatment. The conditions of hydrogen ion implantation are:

(1) no implantation,
(2) $1\times10^{15}$ atoms/cm$^2$ at 11 kev, and
(3) $2\times10^{15}$ atoms/cm$^2$ at 11 keV.

As seen from data in FIG. 17, the more the implantation quantity of hydrogen ion is, the higher the boron concentration at a p$^-$ region is. Under condition (3), the concentration becomes higher than before activating. Also, there is observed no difference in boron concentration profile between a level of $5\times10^{14}$ atoms/cm$^2$ at 11 keV (not shown) and a level of no hydrogen ion implantation. The above phenomena are caused because during enhanced diffusion in the thermal treatment, boron is captured into damage regions generated by the hydrogen ion implantation. Namely, by controlling properly the energy and quantity of hydrogen ion implantation, a variation in boron concentration at p-n junction caused by the enhanced diffusion can be controlled. On the other hand, the hydrogen ion implantation exceeding $4\times10^{15}$ atoms/cm$^2$ may cause abnormal leakage current at junction. Accordingly, in this invention, hydrogen ions are to be implanted at an implantation quantity of more than $1\times10^{15}$ atoms/cm$^2$ and less than $4\times10^{15}$ atoms/cm$^2$.

Thus, by conducting the hydrogen ion implantation under the proper conditions, the reduction in boron concentration in the region with a low boron concentration in FIGS. 4A and 4B can be suppressed. As a result, a decrease in boron concentration in the well region and an increase in boron concentration in the channel region in FIGS. 4A and 4B can be suppressed, thereby suppressing the short-channel effect and reverse short-channel effect. These results will be explained in FIG. 18. FIG. 18 shows measured threshold voltages of n-MOSFET fabricated by using the method of the invention that the hydrogen ion implantation of $1\times10^{15}$ atoms/cm$^2$ is conducted before the thermal treatment for activating a source/drain region and n-MOSFET fabricated by using the conventional method. In n-MOSFET fabricated with no hydrogen implantation shown by ○ and a dotted line, the threshold voltage becomes maximum at around a gate length of 0.35 μm and reduces as a gate length is longer than this. This is analogous to the reverse short-channel effect shown in FIG. 3. Namely, it is proved that a reverse short-channel effect is generating in n-MOSFET fabricated with no hydrogen implantation by using the conventional method. On the contrary, in n-MOSFET fabricated with hydrogen ion implantation shown by ● and a full line, such a tendency as observed in n-MOSFET fabricated with no hydrogen implantation is not observed. Thus, it is proved that the reverse short-channel effect is suppressed. Furthermore, in n-MOSFET fabricated with hydrogen ion implantation, the threshold voltage is kept higher at a region with a gate length of less than 0.2 μm. Thus, it is proved that the short-channel effect is also suppressed.

BRIEF DESCRIPTION OF THE DRAWINGS

The invention will be explained in more detail in conjunction with the appended drawings, wherein:

FIGS. 9A to 9C are cross sectional views showing a method for making a MIS transistor in a second preferred embodiment according to the invention.

DESCRIPTION OF THE PREFERRED EMBODIMENTS

A method for making a MIS transistor in the first preferred embodiment will be explained in FIGS. 7A to 8B.

Figure 1A:
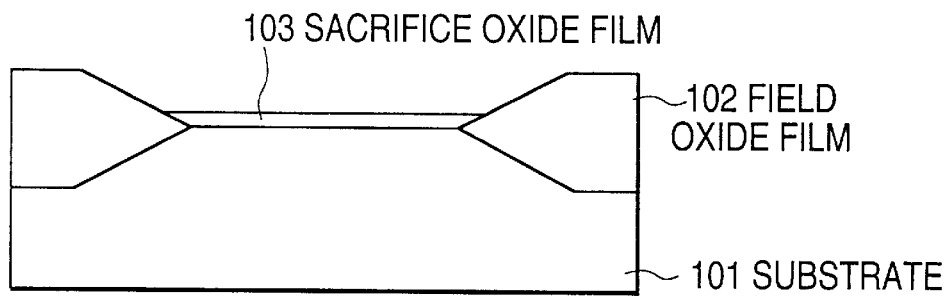
FIGS. 1A to 1C and 2A to 2B are cross sectional views showing a conventional method for making n-MOSFET.
Figure 1B:
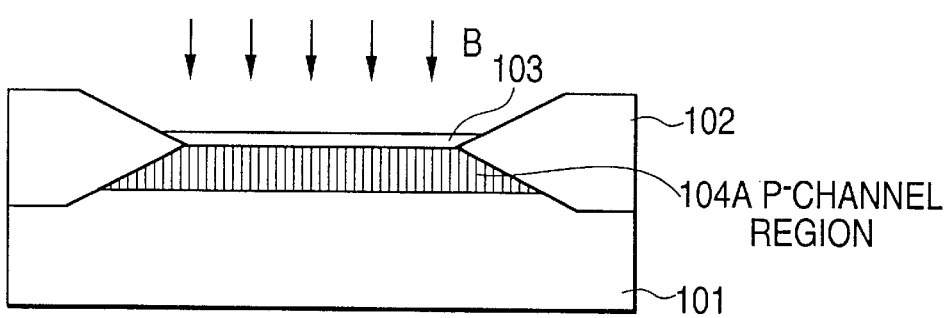
Figure 1C:
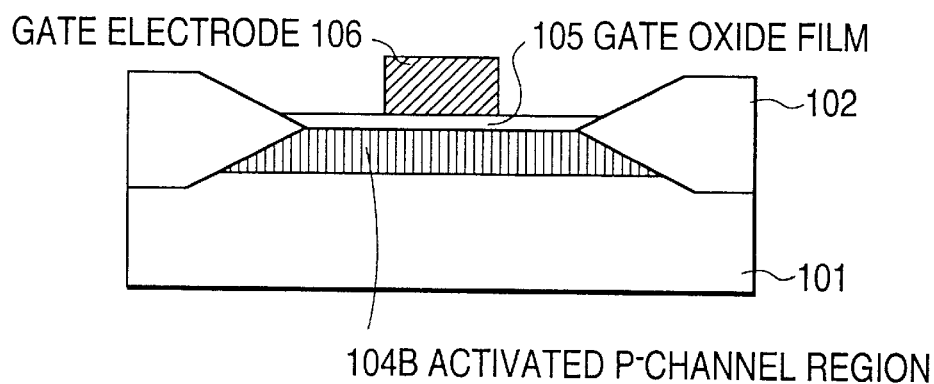
Figure 2A:
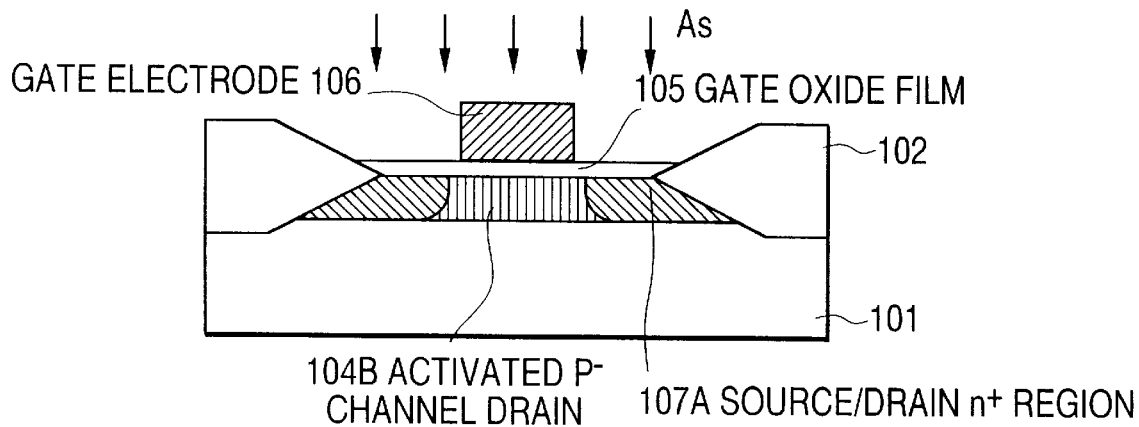
Figure 2B:
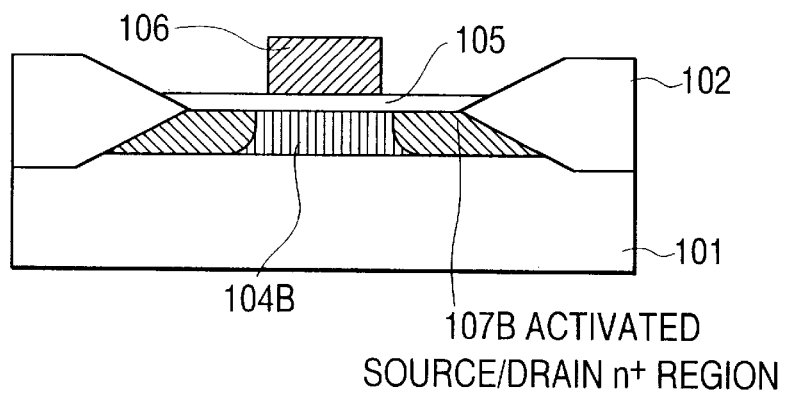
Figure 3:
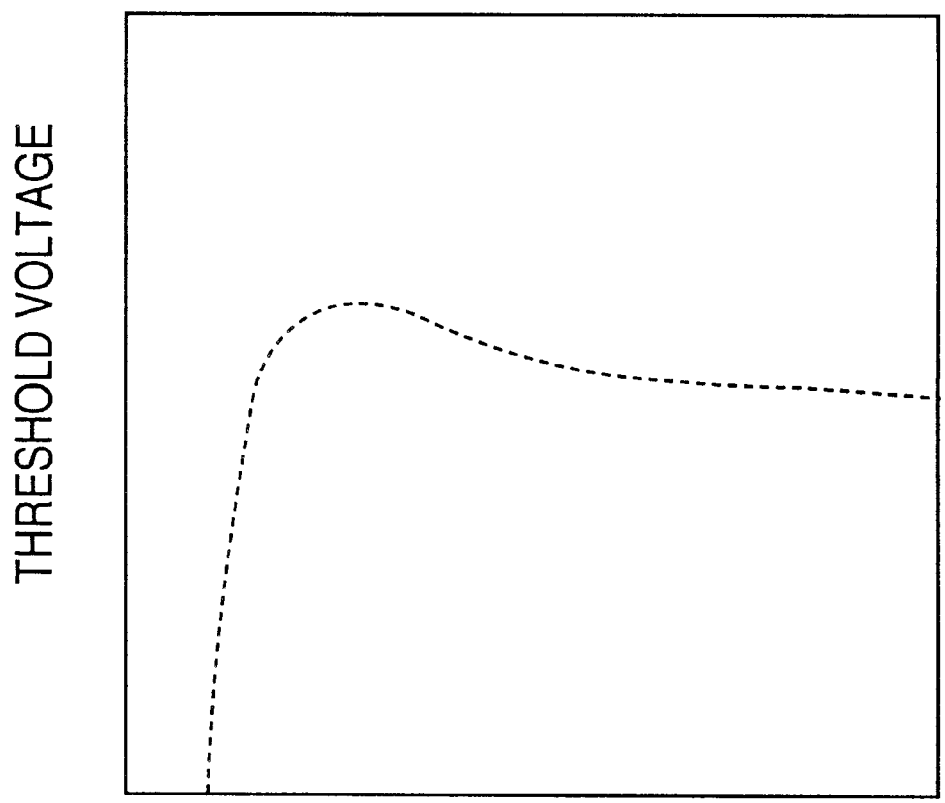
FIG. 3 is a graph showing an reverse short-channel effect in a conventional n-MOSFET.
Figure 4A:
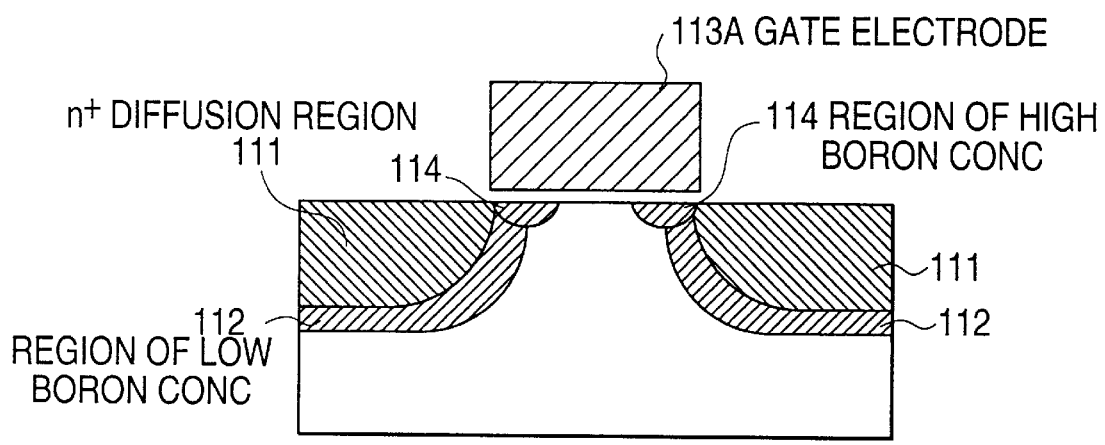
FIGS. 4A and 4B are cross sectional views showing two n-MOSFETs with different channel lengths.
Figure 4B:
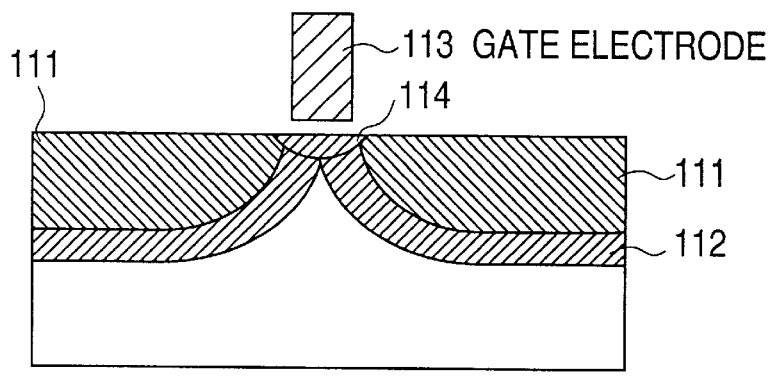
Figure 5A:
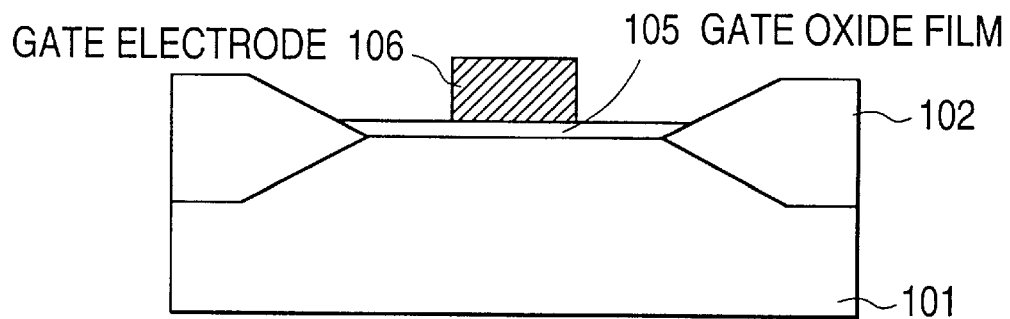
FIGS. 5A to 5C and 6A to 6B are cross sectional views showing a conventional method for making n-MOSFET disclosed in Japanese patent application laid-open No. 8-18047.
Figure 5B:
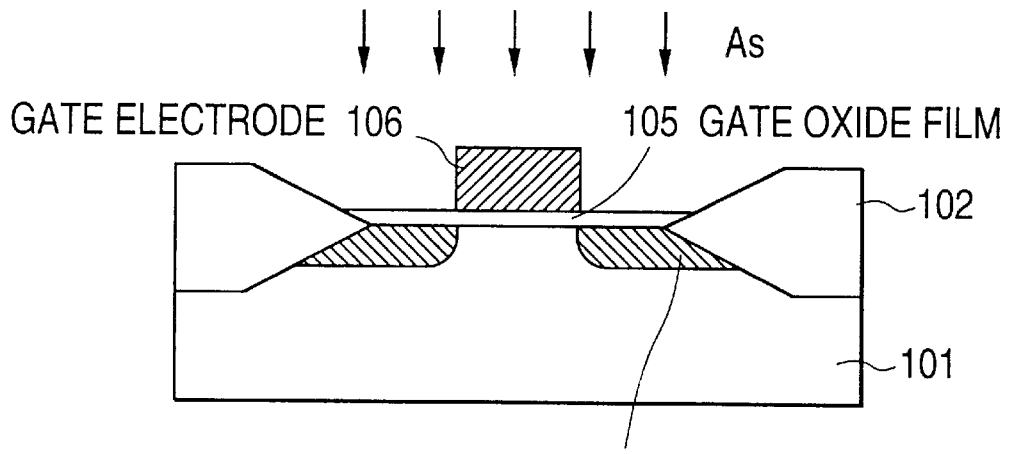
Figure 5C:
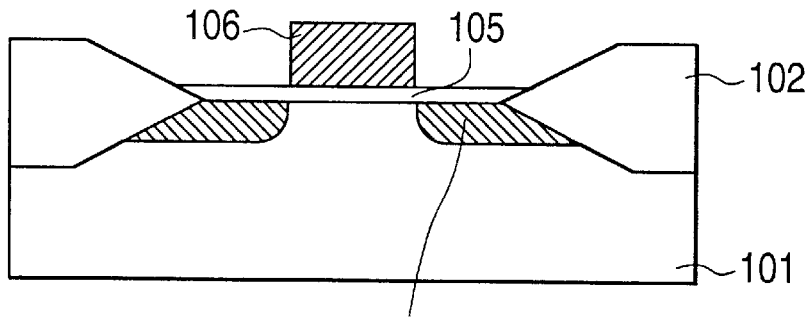
Figure 6A:
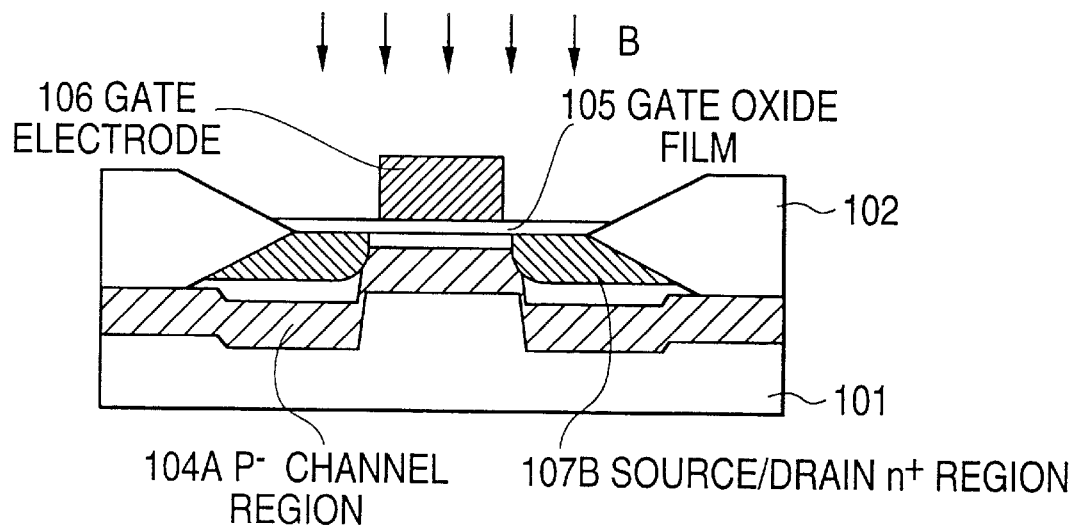
Figure 6B:
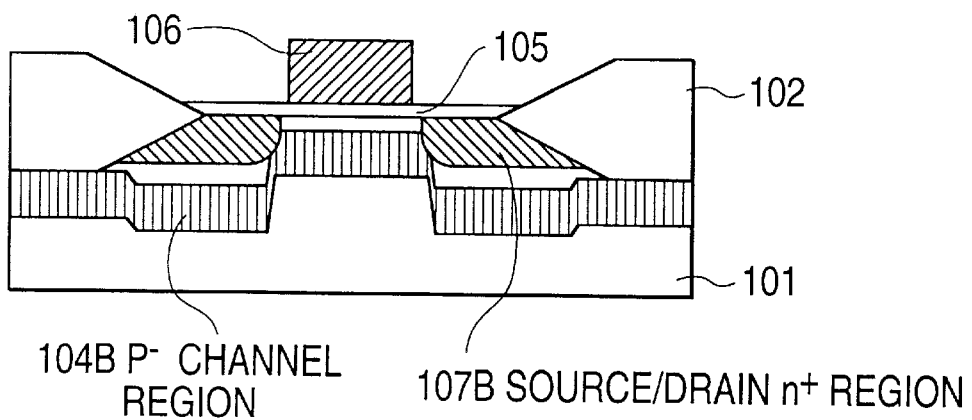
Figure 7A:
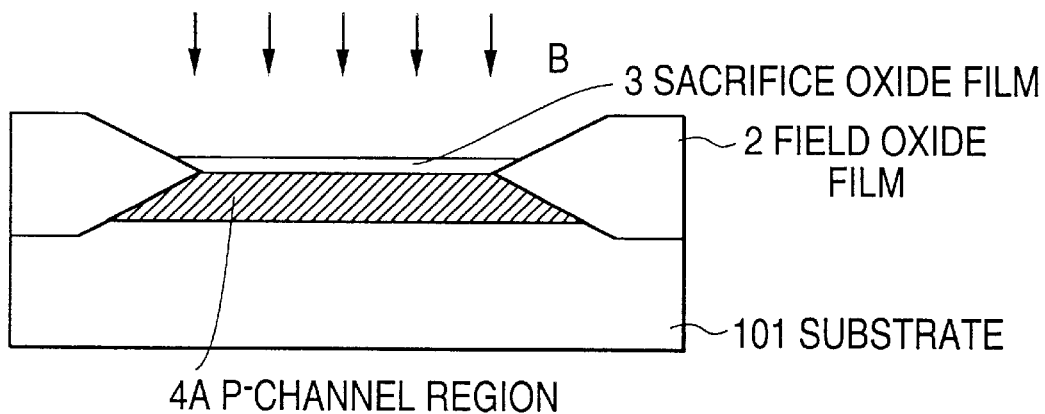
FIGS. 7A to 7C and 8A to 8B are cross sectional views showing a method for making a MIS transistor in a first preferred embodiment according to the invention.

At first, field oxide film 2 in the device separating region and sacrifice oxide film 3 as insulating film in the device region are in advance formed by using LOCOS (local oxidation of silicon) etc. on a p-type semiconductor substrate 1. Also, a p-well may be formed in advance. Then, as shown in FIG. 7A, by ion-implanting boron (B) to control a threshold voltage of n-MOSFET through the sacrifice oxide film 103 into the device region, a p$^-$ channel region 4A is formed.

Figure 7B:
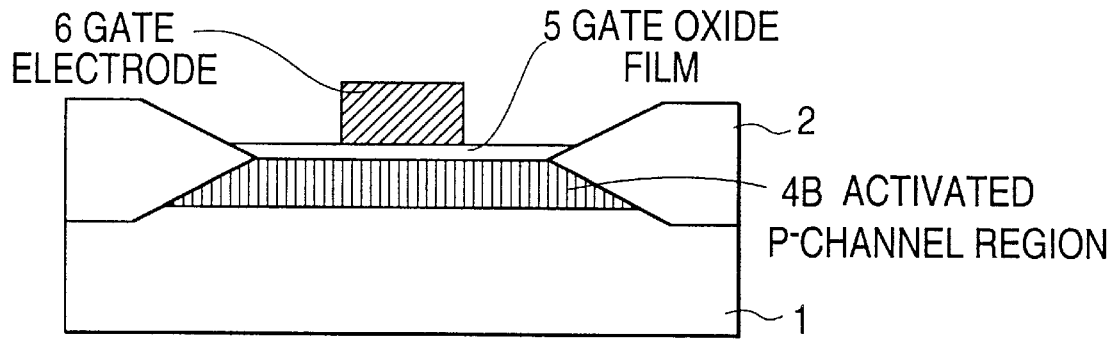

Then, the thermal treatment is conducted to recover the damage of the boron implantation and to activate boron in a nitrogen atmosphere. Thereby, the p$^-$ channel region 4A is changed into an activated p$^-$ channel region 4B. Further, the sacrifice oxide film 3 is removed by etching. Then, as shown in FIG. 7B, gate oxide film 5 and a gate electrode 6 are sequentially formed.

Figure 7C:
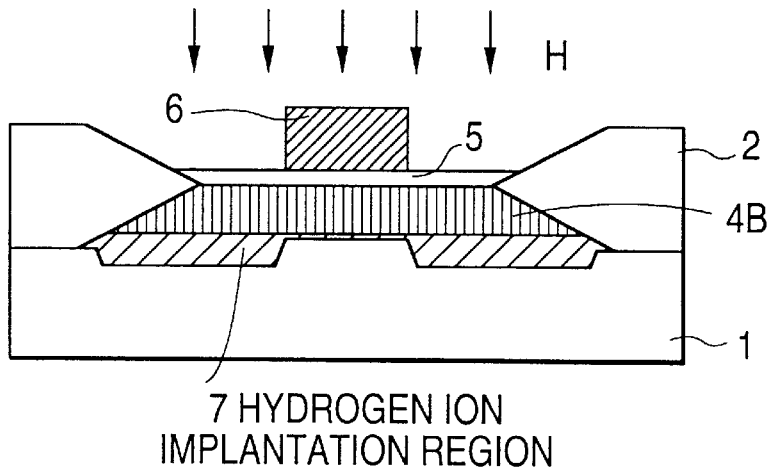

Then, as shown in FIG. 7C, hydrogen (H) is ion-implanted through the gate oxide film 5 and gate electrode 6 into the activated p$^-$ channel region 4B. Hydrogen ions are implanted at an implantation quantity of more than $1\times10^{15}$ atoms/cm$^2$. Thereby, a hydrogen ion implantation region 7 is formed.

Figure 8A:
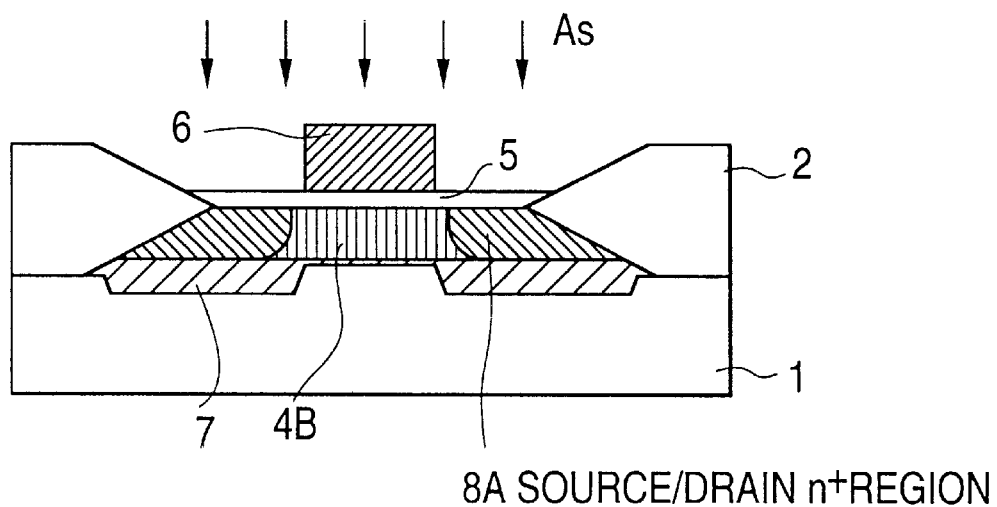
Figure 8B:
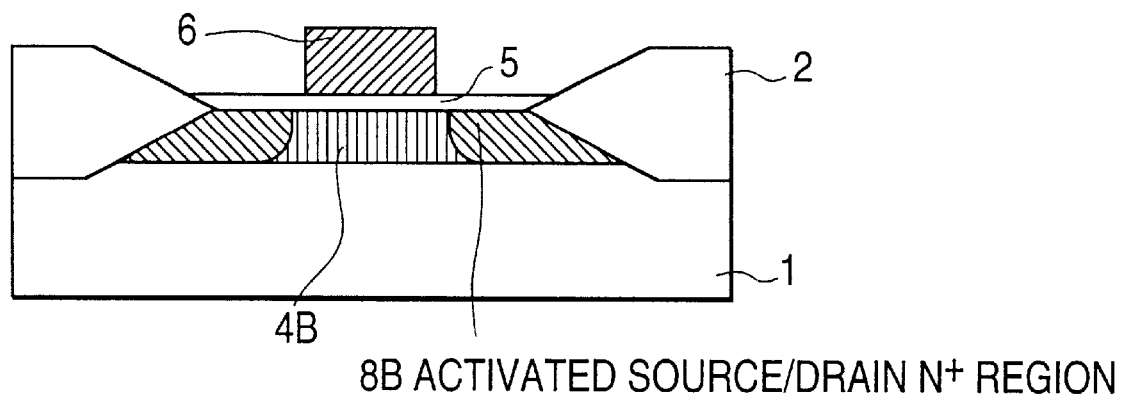

Then, as shown in FIG. 8A, arsenic (As) ions as an impurity of a conductivity type reverse to that of boron are implanted $1\times10^{15}$ to $5\times10^{15}$ atoms/cm$^2$ self-aligned to the gate electrode 6. Thereby, a source/drain n$^+$ region 8A is formed. Finally, as shown in FIG. 8B, the thermal treatment of 800° C. in an inert-gas atmosphere or nitrogen atmosphere is conducted to sufficiently electrically activate the source/drain n$^+$ region 8A formed by the arsenic implantation in FIG. 8A. Thereby, an activated source/drain n$^+$ region 8B is formed. Also, hydrogen diffuses inside and outside the semiconductor substrate, thereby hydrogen in the hydrogen ion implantation region 7 disappears. Thus, the fabrication of n-MOSFET is completed.

The reason why the thermal treatment to electrically activate the implanted arsenic is conducted at a temperature of higher than 800° C. is as follows: It is known that arsenic of up to $3\times10^{15}$ atoms/cm$^2$, which is ion-implanted to form a source/drain region, is electrically 100% activated by annealing at 800 to 900° C. Also, it is known that, at a high implantation quantity of about $1\times10^{16}$ atoms/cm$^2$, the damage can be recovered to saturate the mobility by annealing at 800 to 900° C. (reference: K. Gamou, "Semiconductor Ion Implantation Techniques", p. 58, 1986, Sangyo-Tosho). The optimum conditions of ion implantation quantity in the invention lie within the above conditions of implantation quantity. Meanwhile, the thermal treatment exceeding 1100° C. may cause a reduction in effective channel length, thereby worsening the short-channel effect. Thus, by conducting the thermal treatment at a temperature of higher than 800° C. and less than 1100° C., the electrical activation of arsenic can be securely performed.

In this embodiment, the source/drain n$^+$ region 8A is activated into a source/drain n$^+$ region 8B by ultraviolet-lamp-annealing at 1000° C. for 10 sec. Also, in this embodiment, the hydrogen ion implantation can be conducted without problem even after forming the source/drain n$^+$ region 8A.

A method for making a MIS transistor in the second preferred embodiment will be explained in FIGS. 9A to 9C. The second embodiment relates especially to the fabrication of a LDD (light doped drain) transistor. The steps as shown in FIGS. 7A, 7B and 7C are first preformed.

Then, as shown in FIG. 9A, arsenic (As) ions as an impurity of a conductivity type reverse to that of boron are implanted $1\times10^{13}$ to $5\times10^{14}$ atoms/cm$^2$ self-aligned to the gate electrode 6. Thereby, an LDD n$^-$ region 9A is formed. At this time, the thermal treatment at higher than 800° C. in an inert atmosphere or nitrogen atmosphere may be conducted to activate the LDD n$^-$ region 9A.

Further, as shown in FIG. 9B, after forming sidewall spacers 10 on the sides of the gate electrode 6, arsenic is ion-implanted $1\times10^{15}$ to $5\times10^{15}$ atoms/cm$^2$ self-aligned to the gate electrode 6. Thereby, the source/drain n$^+$ region 8A is formed.

Finally, as shown in FIG. 9C, the thermal treatment of 800° C. in an inert-gas atmosphere or nitrogen atmosphere is conducted to sufficiently electrically activate the implanted arsenic. Thus, the fabrication of n-MOSFET is completed.

In this embodiment, the source/drain n$^+$ region 8A is activated into a source/drain n$^+$ region 8B by ultraviolet-lamp-annealing at 1000° C. for 10 sec. Also, in this embodiment, the hydrogen ion implantation can be conducted without problem even after forming the source/drain n$^+$ region 8A.

A method for making a MIS transistor in the third preferred embodiment will be explained in FIGS. 10, 11, 12, 13A, 13B. The third embodiment relates especially to the fabrication of a LDD transistor and is a modification to the second embodiment. In particular, insulating film to be formed at a high temperature, such as HTO (high temperature oxide) film, is adopted as sidewall spacer for LDD.

The steps as shown in FIGS. 7A, 7B and 7C are first preformed.

Figure 10:
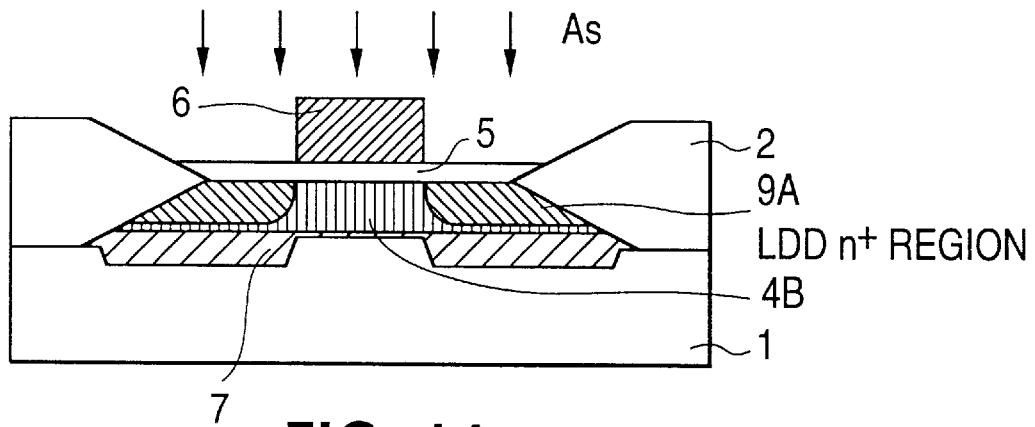
FIGS. 10 to 12 and 13A to 13B are cross sectional views showing a method for making a MIS transistor in a third preferred embodiment according to the invention.

Then, as shown in FIG. 10, arsenic (As) ions as an impurity of a conductivity type reverse to that of boron are implanted $1\times10^{13}$ to $5\times10^{14}$ atoms/cm2 self-matchingly, i.e., self-aligning, to the gate electrode 6. Thereby, an LDD n$^-$ region 9A is formed. At this time, the thermal treatment at higher than 800° C. in an inert atmosphere or nitrogen atmosphere may be conducted to activate the LDD n$^-$ region 9A.

Figure 11:
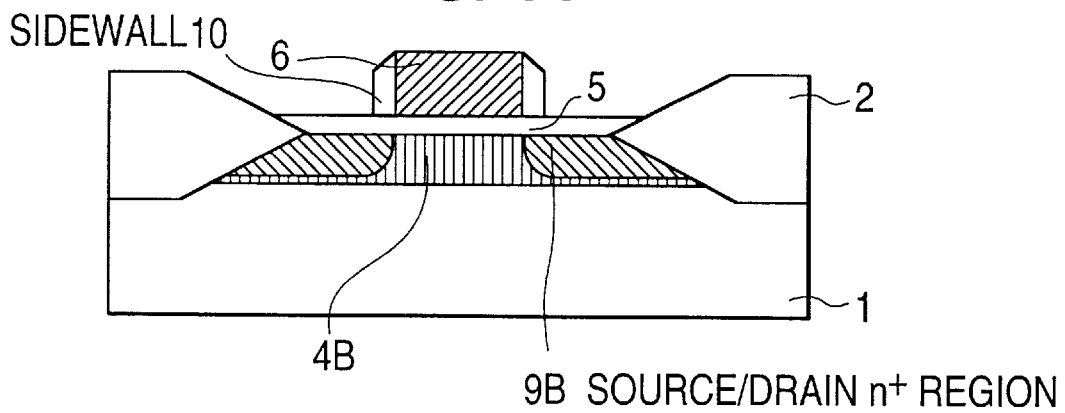

Then, after forming HTO film on the entire surface of the semiconductor substrate by the CVD method, the HTO film is isotropic-etched-back to form sidewall spacers 10 only on the sides of the gate electrode 6 as shown in FIG. 11. The HTO film is formed by reacting SiH$_4$ and N$_2$O at about 800° C.

Figure 12:
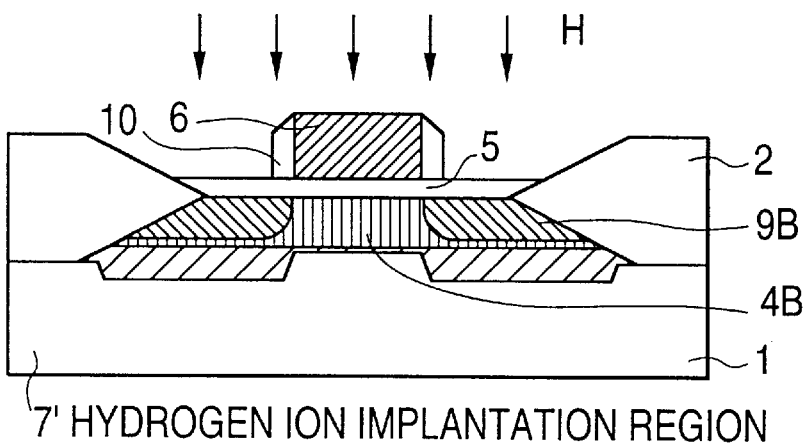

The LDD n$^-$ region 9A is activated into a LDD n$^-$ region 9B on the step of forming the HTO film. Also, in the HTO film forming step, hydrogen is detached and the damage region is recovered. Therefore, as shown in FIG. 12, hydrogen (H) is ion-implanted again to form a second hydrogen ion implantation region 7'.

Figure 13A:
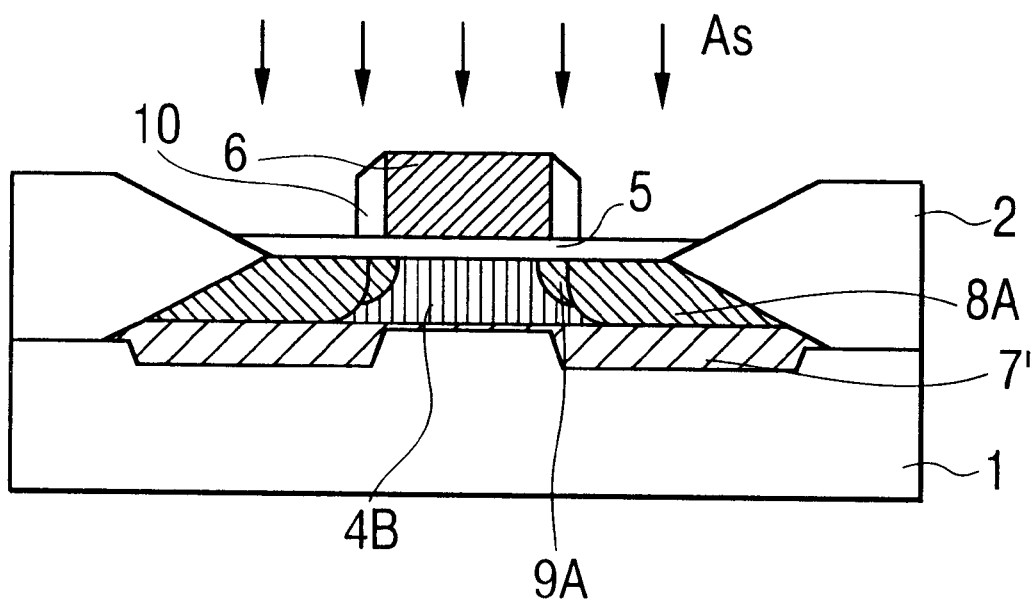

Then, as shown in FIG. 13A, arsenic is ion-implanted $1\times10^{15}$ to $5\times10^{15}$ atoms/cm$^2$ self-matchingly to the gate electrode 6. Thereby, the source/drain n$^+$ region 8A is formed.

Figure 13B:
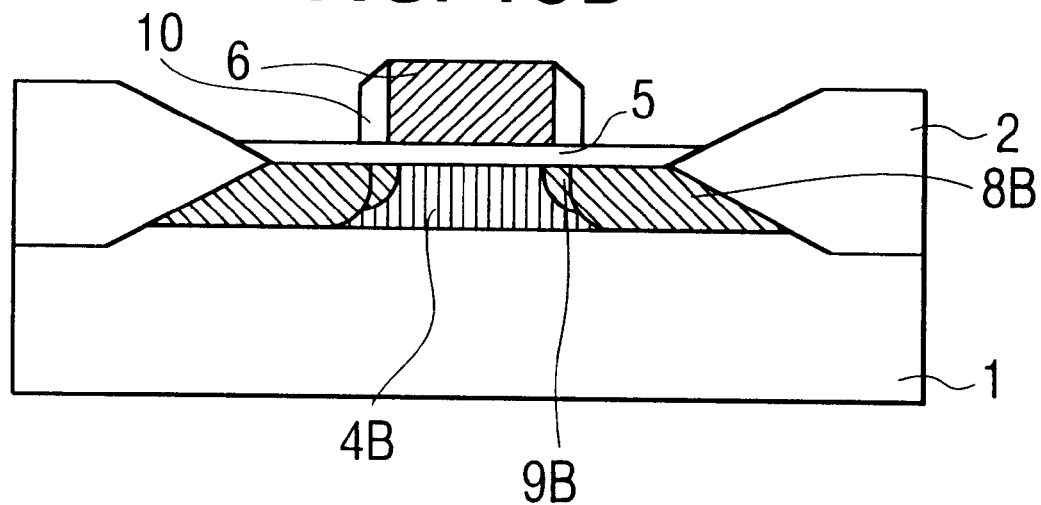
Figure 14:
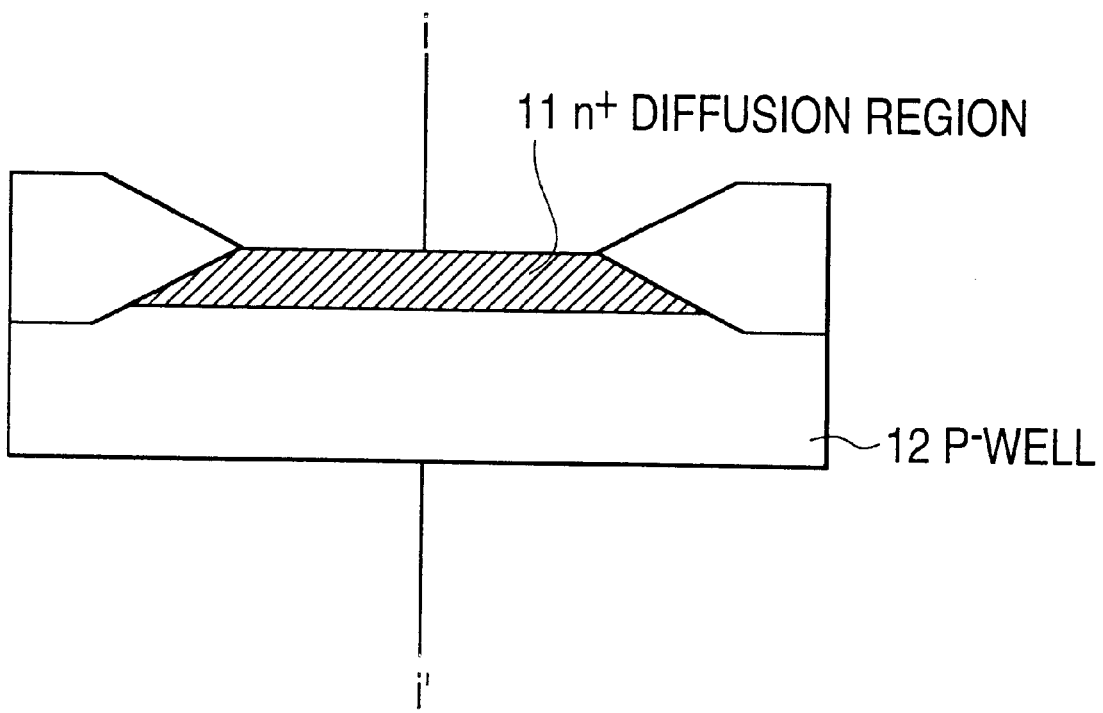
FIG. 14 is a cross sectional view showing a semiconductor device with a n$^+$ diffusion region and a p-well.
Figure 15:
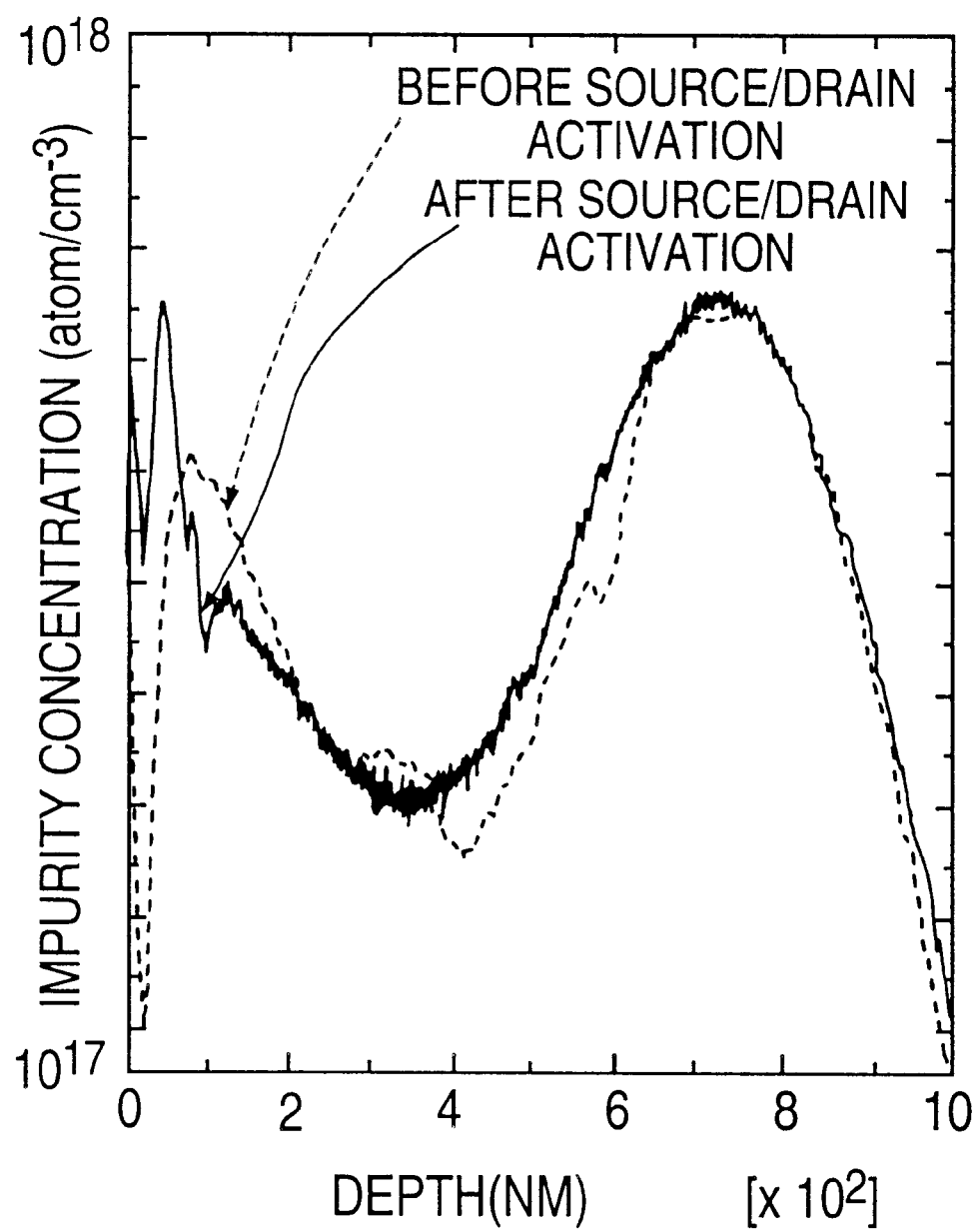
FIG. 15 is a graph showing boron profiles in the depth direction before and after activating arsenic in a source/drain region.
Figure 16:
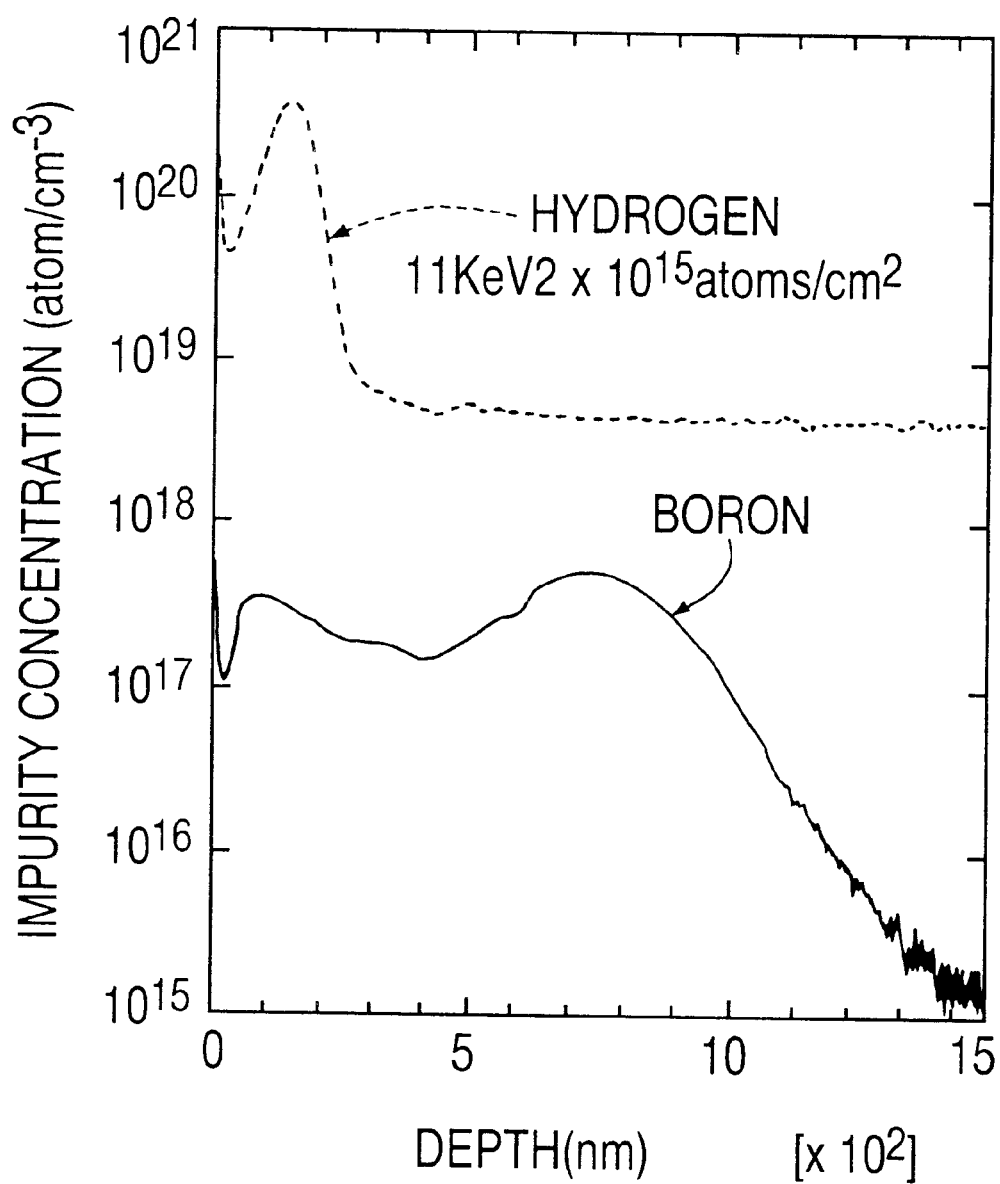
FIG. 16 is a graph showing the concentration profiles in the depth direction of hydrogen to be ion-implanted $2\times10^{15}$ atoms/cm$^2$ at 11 keV and of boron to be ion-implanted under the conditions in FIG. 15.
Figure 17:
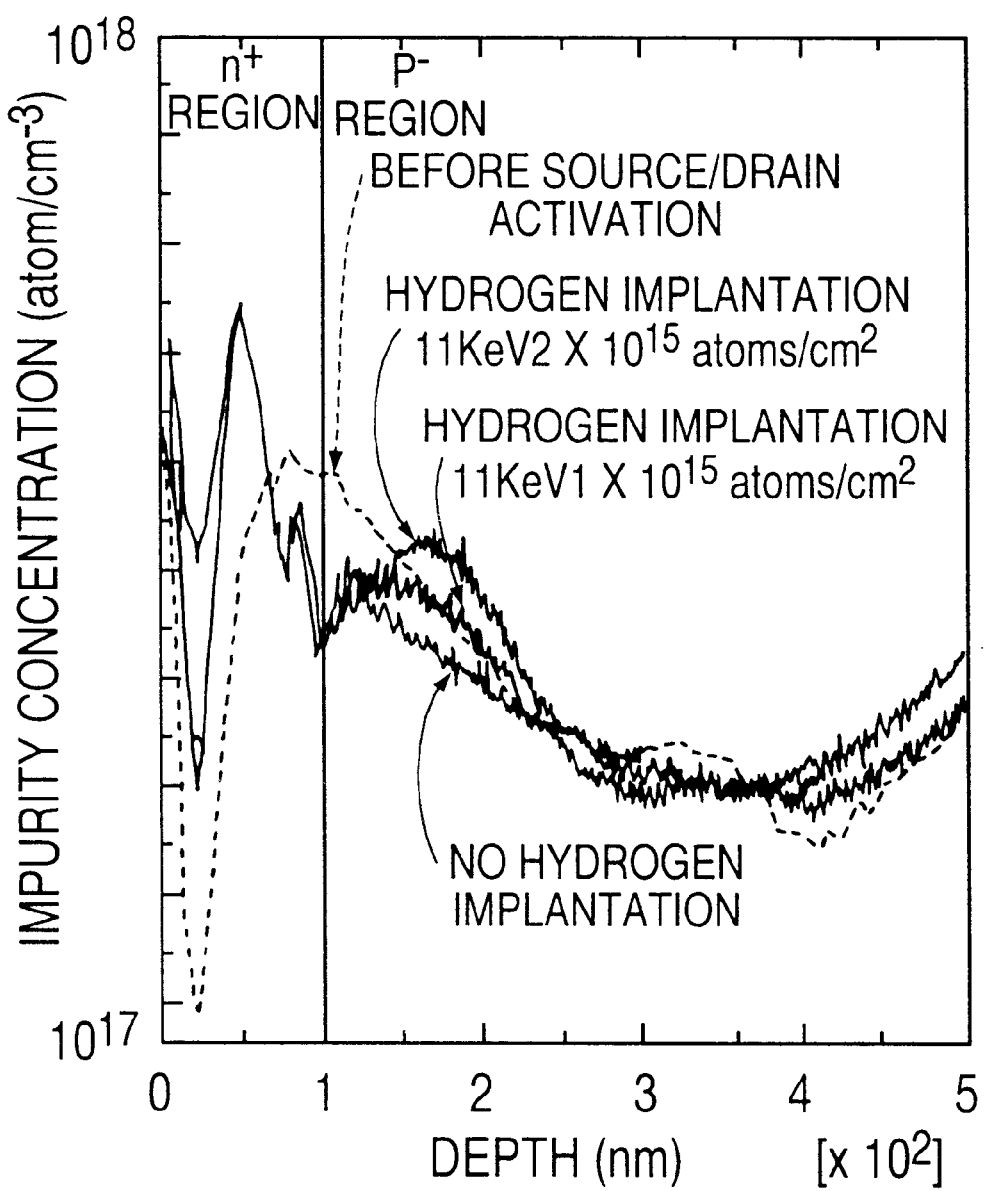
FIG. 17 is a graph showing the hydrogen-ion-implantation dose dependency of boron concentration profile after the activation by thermal treatment of 1020° C. for 10 sec.
Figure 18:
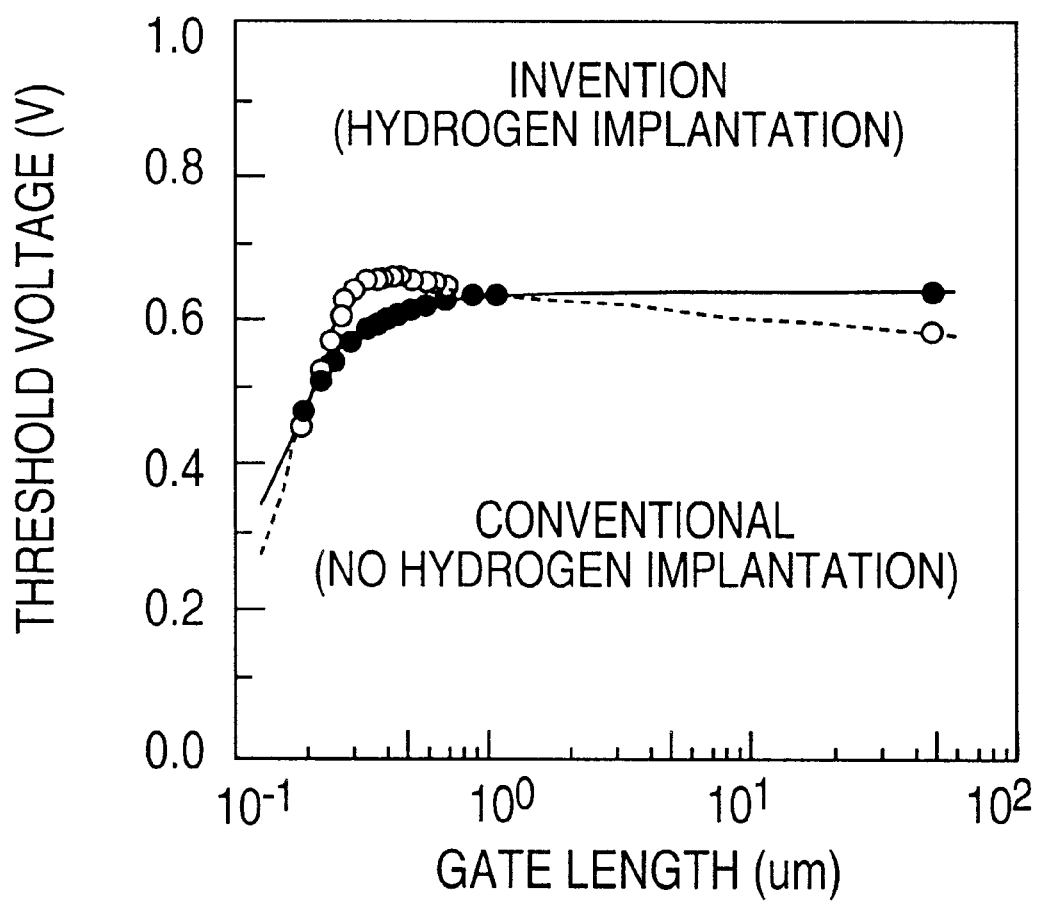
FIG. 18 is a graph showing the measured threshold voltages of n-MOSFET fabricated by using the method of the invention that the hydrogen ion implantation of $1\times10^{15}$ atoms/cm$^2$ is conducted before the thermal treatment for activating a source/drain region and n-MOSFET fabricated by using the conventional method.

Finally, as shown in FIG. 13B, the thermal treatment of 800° C. in an inert-gas atmosphere or nitrogen atmosphere is conducted to sufficiently electrically activate the implanted arsenic. Thus, the fabrication of n-MOSFET is completed.

In this embodiment, the source/drain n$^+$ region 8A is activated into a source/drain n$^+$ region 8B by ultraviolet-lamp-annealing at 1000° C. for 10 sec. Also, in this embodiment, the first hydrogen ion implantation can be conducted without problem even after forming the LDD n$^-$ region 9A. Further, the second hydrogen ion implantation can be conducted without problem even after forming the source/drain n$^-$ region 8A.

The above embodiments can be also applied to fabrication of p-MOSFET.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a MIS transistor having a gate electrode and gate insulating film on a semiconductor substrate with a channel region formed with an impurity of a positive conductivity type, comprising performing the steps in the order recited of:

implanting hydrogen ions through said gate electrode and gate insulating film into said channel region under said gate electrode;

ion-implanting an impurity of a negative conductivity type self-aligned to said gate electrode to form a source/drain region; and conducting thermal treatment in an inert atmosphere or nitrogen atmosphere.

2. A method for making a MIS transistor, according to claim 1, further comprising the step of:

ion-implanting self-aligned to said gate electrode to form a LDD region before said step of forming said source/drain region.

3. A method for making a MIS transistor having a gate electrode and gate insulating film on a semiconductor substrate with a channel region formed with an impurity of a first conductivity type thereinto, comprising the steps of:

ion-implanting an impurity of a conductivity type opposite to said first conductivity type self-aligned to said gate electrode to form a source/drain region;

implanting hydrogen ions through said gate electrode and gate insulating film into said channel region under said gate electrode; and conducting thermal treatment in an inert atmosphere or nitrogen atmosphere.

4. A method for making a MIS transistor having a gate electrode and gate insulating film on a semiconductor substrate with a channel region formed with an impurity of one conductivity type, comprising performing the steps in the order recited of:

implanting hydrogen ions through said gate electrode and gate insulating film into said channel region under said gate electrode;

ion-implanting a first impurity of a conductivity type reverse to said one conductivity type self-aligned to said gate electrode to form a LDD region;

ion-implanting a second impurity of the same conductivity type as said first impurity self-aligned to said gate electrode to form a source/drain region; and conducting thermal treatment in an inert atmosphere or nitrogen atmosphere.

5. A method for making a MIS transistor having a gate electrode and gate insulating film on a semiconductor substrate with a channel region formed with an impurity of a first conductivity type thereinto, comprising the steps of:

ion-implanting a first impurity of a conductivity type opposite to said first conductivity type self-aligned to said gate electrode to form a LDD region;

ion-implanting a second impurity of the same conductivity type as said first impurity self-aligned to said gate electrode to form a source/drain region;

implanting hydrogen ions through said gate electrode and gate insulating film into said channel region under said gate electrode; and conducting thermal treatment in an inert atmosphere or nitrogen atmosphere.

6. A method for making a MIS transistor having a gate electrode and gate insulating film on a semiconductor substrate with a channel region formed with an impurity of one conductivity type, comprising performing the steps in the order recited of:

implanting hydrogen ions through said gate electrode and gate insulating film into said channel region under said gate electrode;

ion-implanting a first impurity of a conductivity type reverse to said one conductivity type self-aligned to said gate electrode to form a LDD region;

conducting first thermal treatment in inert atmosphere or nitrogen atmosphere;

ion-implanting a second impurity of the same conductivity type as said first impurity self-aligned to said gate electrode to form a source/drain region; and conducting second thermal treatment in an inert atmosphere or nitrogen atmosphere.

7. A method for making a MIS transistor having a gate electrode and gate insulating film on a semiconductor substrate with a channel region formed with an impurity of a first conductivity type thereinto, comprising the steps of:

ion-implanting a first impurity of a conductivity type opposite to said first conductivity type self-aligned to said gate electrode to form a LDD region;

implanting hydrogen ions through said gate electrode and gate insulating film into said channel region under said gate electrode;

conducting first thermal treatment in an inert atmosphere or nitrogen atmosphere;

ion-implanting a second impurity of the same conductivity type as said first impurity self-aligned to said gate electrode to form a source/drain region; and conducting second thermal treatment in an inert atmosphere or nitrogen atmosphere.

8. A method for making a MIS transistor having a gate electrode and gate insulating film on a semiconductor substrate with a channel region formed with an impurity of one conductivity type, comprising performing the steps in the order recited of:

implanting hydrogen ions through said gate electrode and gate insulating film into said channel region under said gate electrode;

ion-implanting a first impurity of a conductivity type reverse to said one conductivity type self-aligned to said gate electrode to form a LDD region;

conducting first thermal treatment in an inert atmosphere or nitrogen atmosphere;

implanting hydrogen ions through said gate electrode and gate insulating film into said channel region under said gate electrode;

ion-implanting a second impurity of the same conductivity type as said first impurity self-aligned to said gate electrode to form a source/drain region; and conducting second thermal treatment in an inert atmosphere or nitrogen atmosphere.

9. A method for making a MIS transistor having a gate electrode and gate insulating film on a semiconductor substrate with a channel region formed with an impurity of one conductivity type, comprising performing the steps in the order recited of:

ion-implanting a first impurity of a conductivity type reverse to said one conductivity type self-aligned to said gate electrode to form a LDD region;

implanting hydrogen ions through said gate electrode and gate insulating film into said channel region under said gate electrode;

conducting first thermal treatment in an inert atmosphere or nitrogen atmosphere;

implanting hydrogen ions through said gate electrode and gate insulating film into said channel region under said gate electrode;

ion-implanting a second impurity of the same conductivity type as said first impurity self-aligned to said gate electrode to form a source/drain region; and conducting second thermal treatment in an inert atmosphere or nitrogen atmosphere.

10. A method for making a MIS transistor having a gate electrode and gate insulating film on a semiconductor substrate with a channel region formed with an impurity of one conductivity type, comprising performing the steps in the order recited of:

implanting hydrogen ions through said gate electrode and gate insulating film into said channel region under said gate electrode;

ion-implanting a first impurity of a conductivity type reverse to said one conductivity type self-aligned to said gate electrode to form a LDD region;

conducting first thermal treatment in an inert atmosphere or nitrogen atmosphere;

ion-implanting a second impurity of the same conductivity type as said first impurity self-aligned to said gate electrode to form a source/drain region;

implanting hydrogen ions through said gate electrode and gate insulating film into said channel region under said gate electrode; and conducting second thermal treatment in an inert atmosphere or nitrogen atmosphere.

11. A method for making a MIS transistor having a gate electrode and gate insulating film on a semiconductor substrate with a channel region formed with an impurity of one conductivity type, comprising performing the steps in the order recited of:

ion-implanting a first impurity of a conductivity type reverse to said one conductivity type self-aligned to said gate electrode to form a LDD region;

implanting hydrogen ions through said gate electrode and gate insulating film into said channel region under said gate electrode;

conducting first thermal treatment in an inert atmosphere or nitrogen atmosphere;

ion-implanting a second impurity of the same conductivity type as said first impurity self-aligned to said gate electrode to form a source/drain region;

implanting hydrogen ions through said gate electrode and gate insulating film into said channel region under said gate electrode; and conducting second thermal treatment in an inert atmosphere or nitrogen atmosphere.

12. A method for making a MIS transistor, according to claim 1, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

13. A method for making a MIS transistor, according to claim 2, wherein:

said stop of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

14. A method for making a MIS transistor, according to claim 3, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

15. A method for making a MIS transistor, according to claim 4, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

16. A method for making a MIS transistor, according to claim 5, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

17. A method for making a MIS transistor, according to claim 6, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

18. A method for making a MIS transistor, according to claim 7, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

19. A method for making a MIS transistor, according to claim 8, wherein:

said step of implanting hydrogen ions into said channel region under said sate electrode is conducted with a hydrogen implantation quantity of more than $1\times10^{15}$ atoms/cm$^2$ and less than $4\times10^{15}$ atoms/cm$^2$.

20. A method for making a MIS transistor, according to claim 9, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

21. A method for making a MIS transistor, according to claim 10, wherein;

said step of implanting hydrogen ions into said channel region under said gate electrode is conducted with a hydrogen implantation quantity of tore than $1\times10^{15}$ atoms/cm$^2$ and less than $4\times10^{15}$ atoms/cm$^2$.

22. A method for making a MIS transistor, according to claim 11, wherein:

said step of implanting hydrogen ions into said channel region under said gate electrode is conducted with a hydrogen implantation quantity of more than $1\times10^{15}$ atoms/cm$^2$ and less than $4\times10^{15}$ atoms/cm$^2$.

23. A method for making a MIS transistor, according to claim 1, wherein:

said thermal treatment is conducted at a temperature of higher than 800° C. and lower than 1100° C.

24. A method for making a MIS transistor, according to claim 2, wherein:

said thermal treatment is conducted at a temperature of higher than 800° C. and lower than 1100° C.

25. A method for making a MIS transistor, according to claim 3, wherein:

said thermal treatment is conducted at a temperature of higher than 800° C. and lower than 1100° C.

26. A method for making a MIS transistor, according to claim 4, wherein:

said thermal treatment is conducted at a temperature of higher than 800° C. and lower than 1100° C.

27. A method for making a MIS transistor, according to claim 5, wherein:

said thermal treatment is conducted at a temperature of higher than 800° C. and lower than 1100° C.

28. A method for making a MIS transistor, according to claim 6, wherein:

said second thermal treatment is conducted at a temperature of higher than 800° C. and lower than 1100° C.

29. A method for making a MIS transistor, according to claim 7, wherein:

said second thermal treatment is conducted at a temperature of higher than 800° C. and lower than 1100° C.

30. A method for making a MIS transistor, according to claim 8, wherein:

said second thermal treatment is conducted at a temperature of higher than 800° C. and lower than 1100° C.

31. A method for making a MIS transistor, according to claim 9, wherein:

said second thermal treatment is conducted at a temperature of higher than 800° C. and lower than 1100° C.

32. A method for making a MIS transistor, according to claim 10, wherein:

said second thermal treatment is conducted at a temperature of higher than 800° C. and lower than 1100° C.

33. A method for making a MIS transistor, according to claim 11, wherein:

said second thermal treatment is conducted at a temperature of higher than 800° C. and lower than 1100° C.

34. A method for making a MIS transistor having a gate electrode and gate insulating film on a semiconductor substrate with a channel region formed with an impurity of a first conductivity type, comprising performing the steps in the order recited of:

implanting hydrogen ions through said gate electrode and gate insulating film into said channel region under said gate electrode;

ion-implanting an impurity of a conductivity type that is opposite to said first conductivity type self-aligned to said gate electrode to form a source/drain region; and conducting thermal treatment in an inert atmosphere or nitrogen atmosphere.

35. A method for making a MIS transistor having a gate electrode and gate insulating film on a semiconductor substrate with a channel region formed with an impurity of a first conductivity type, comprising performing the steps in the order recited of:

ion-implanting a first impurity of a conductivity type that is opposite to said first conductivity type self-aligned to said gate electrode to form a LDD region;

implanting hydrogen ions through said gate electrode and gate insulating film into said channel region under said gate electrode;

ion-implanting a second impurity of the same conductivity type as said first impurity self-aligned to said gate electrode to form a source/drain region; and conducting thermal treatment in an inert atmosphere or nitrogen atmosphere.

36. A method for making a MIS transistor having a gate electrode and gate insulating film on a semiconductor substrate with a channel region formed with an impurity of a first conductivity type, comprising performing the steps in the order recited of:

ion-implanting a first impurity of a conductivity type that is opposite to said first conductivity type self-aligned to said gate electrode to form a LDD region;

implanting hydrogen ions through said gate electrode and gate insulating film into said channel region under said gate electrode;

conducting a first thermal treatment in an inert atmosphere or nitrogen atmosphere;

ion-implanting a second impurity of the same conductivity type as said first impurity self-aligned to said gate electrode to form a source/drain region; and conducting a second thermal treatment in an inert atmosphere or nitrogen atmosphere.

* * * * *